(12) United States Patent
Ruffell et al.

(10) Patent No.: US 6,179,921 B1
(45) Date of Patent: Jan. 30, 2001

(54) BACKSIDE GAS DELIVERY SYSTEM FOR A SEMICONDUCTOR WAFER PROCESSING SYSTEM

(75) Inventors: John Ruffell; Karl F. Leeser, both of Sunnyvale, CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/294,258

(22) Filed: Apr. 19, 1999

(51) Int. Cl.[7] .......................... C23C 16/00; C23C 16/458
(52) U.S. Cl. .................. 118/715; 137/625.5; 251/129.22
(58) Field of Search ............................. 279/128; 361/234; 118/728; 137/625.5; 251/129.22

(56) References Cited

U.S. PATENT DOCUMENTS 4,527,620 * 7/1985 Pedersen et al. ..................... 118/728
5,575,311 * 11/1996 Kingsford ......................... 137/625.5

* cited by examiner

Primary Examiner—Jeffrie R. Lund
Assistant Examiner—Sylvia R. MacArthur
(74) Attorney, Agent, or Firm—Thomason, Moser, & Patterson

(57) ABSTRACT

An apparatus for a wafer processing system comprising a wafer support chuck attached to a gas delivery system for delivery of a gas to the backside of a wafer supported by the chuck. The gas delivery system has a gas shutoff valve directly connected to the wafer chuck. The shutoff valve provides a positive shutoff with negligible leak rate. By placing the valve in close proximity to the wafer chuck, the volume of the backside gas trapped between the valve and the wafer is minimized. Release of this trapped gas into the process chamber during wafer transfer has no adverse impact on the performance of the processing system.

19 Claims, 4 Drawing Sheets

BACKSIDE GAS DELIVERY SYSTEM FOR A SEMICONDUCTOR WAFER PROCESSING SYSTEM

BACKGROUND OF THE DISCLOSURE

1. Field of the Invention

The invention relates to a semiconductor wafer processing system, and in particular, to a backside gas delivery system for a semiconductor wafer processing system.

2. Description of the Background Art

Electrostatic chucks (ESC) are used in many single-wafer processing systems for retaining wafers during processing. In order to improve heat conduction between the wafer and the chuck, a backside gas supplied between the wafer and the support surface of the chuck is often used as a heat transfer medium. The design of a backside gas delivery system may have significant impact on the performance of the wafer processing system, especially in cases where stringent pressure control is required. In many existing designs, when the wafer is removed from the chuck upon completion of processing, the backside gas is often allowed to enter the process chamber, resulting in a temporary yet undesirable pressure increase. For certain applications, the increased pumpdown time between wafers may have an adverse impact on the process throughput. An ion implanter, for example, is particularly susceptible to such inadvertent, pressure fluctuations because of the stringent requirement for a low operating pressure, typically in the range of about $10^{-6}$ torr. Any increase in chamber pressure from the backside gas requires additional vacuum pumping and directly results in a decreased throughput. Maintaining a high process throughput is of special concern to a serial ion implanter. Furthermore, a transient pressure increase may result in other adverse effects—e.g., the ion beam may be neutralized, or be deflected onto the side of the flight tube, which may cause contaminants to be sputtered from surfaces within the equipment.

One solution involves a gas delivery system designed to rapidly remove the gas from the wafer backside with limited gas leakage into the process chamber. This is disclosed in a commonly-assigned U.S. patent application Ser. No. 08/154, 509 entitled "Backside Gas Quick Dump Apparatus for a Semiconductor Wafer Processing System", filed on May 12, 1997, and is herein incorporated by reference.

However, there is always an ongoing need for alternative backside gas delivery systems that provide a reliable gas shutoff and minimal pressure increase during wafer transfer. Additionally, a gas delivery system having simplified vacuum connections is also desirable.

SUMMARY OF THE INVENTION

The present invention is an apparatus for a semiconductor wafer processing system comprising a gas delivery system with a shutoff valve directly attached to a wafer support chuck (e.g., an electrostatic chuck).

The gas delivery system is used to deliver a gas between the backside of a wafer and the support surface of the wafer support chuck. The backside gas acts as a heat transfer medium for the wafer during processing, such as ion implant. By providing a shutoff valve in close proximity to the wafer chuck, the backside gas volume between the valve and the backside of the wafer can be minimized. Since the amount of trapped backside gas released into the process chamber from this volume during wafer transfer is negligible compared to the chamber volume, undesirable pressure increase inside the wafer processing system is avoided. Therefore, a high process throughput of the wafer processing system can be maintained.

The shutoff valve comprises two parts—a valve body and a valve seat, each having a narrow conduit to act as a passageway for the backside gas. The top of the valve seat, which has a top recess connected to its conduit, fits inside an opening of the chuck from the backside of the chuck. A batten (fastener), having a narrow conduit along its entire length, fits inside the center opening of the chuck and the top recess of the valve seat. As such, the batten acts as a fastener which secures the top of the valve seat inside the center opening of the chuck. In this configuration, a passageway is defined by the conduit of the batten, the top recess and the conduit of the valve seat. The conduit of the valve seat is connected to a bottom opening which is threaded to the top of the valve body.

A poppet, which has a top portion and a cylindrical shaft, is disposed towards the top of the valve body. The shaft fits through an opening of the valve body from the top such that the top portion of the poppet is located above the opening and the shaft is substantially inside the valve body.

The valve used in this embodiment is a normally closed solenoid valve. When the valve is closed, the top portion of the poppet is sealed against the conduit opening at the bottom of the valve seat, and provides a positive shutoff with a leak rate of less than about $10^{-6}$ sccs. When the valve is actuated to its open position, the poppet retracts away from the valve seat, and a passageway is defined by the interiors of the batten and the valve seat. Thus, a backside gas can be delivered from the gas supply, through the pressure controller and the solenoid valve, to the support surface of the wafer chuck.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
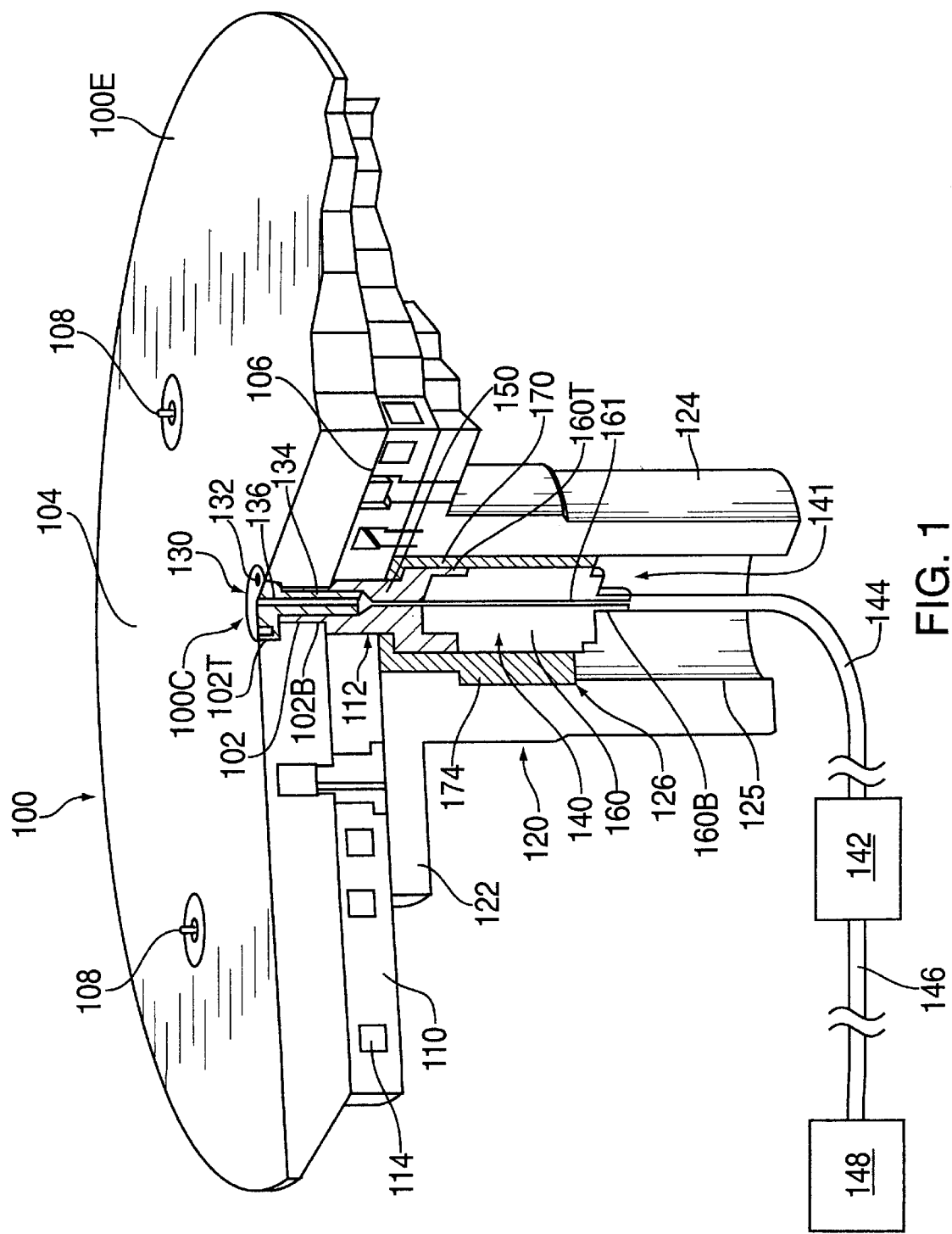
FIG. 1 depicts a schematic illustration of a backside gas delivery system according to the present invention.

The present invention is an apparatus for use with semiconductor wafer processing equipment such as a serial ion implanter. FIG. 1 depicts schematically a partial cross-sectional view of the present invention. A backside gas delivery system 141 is connected to the backside 106 of a wafer support chuck 100, e.g., an electrostatic chuck (ESC), which is fitted with a valve seat 150. The use of an ESC in the present embodiment is for illustrative purpose only. In general, the invention can be practiced with different wafer support chucks used in various ion implanters, including for example, a wafer platen equipped with a clamp ring. The gas delivery system 141 comprises a gas flow shutoff valve 140 connected by a gas line 144 to a gas controller 142, which is in turn connected to a gas supply 148. The gas shutoff valve 140, comprising a valve body 160 and a valve seat 150, is designed to be placed in close proximity (e.g., within two centimeters) of the ESC 100. One can avoid the use of long lengths of gas lines, and thus minimize the volume of the backside gas trapped between the valve 140 and the backside of a wafer (not shown). Therefore, during wafer transfer after processing is complete, only a negligible amount of the backside gas is admitted into the process chamber (not shown), and any adverse effect on the operation of the ion implanter can be avoided.

The ESC 100 is supported by a cooling plate 110, which rests upon a flat circular portion 122 of a spindle 120. The spindle 120 also has a cylindrical hollow shaft 124, which accommodates the valve body 160 and the valve seat 150. The ESC 100, the cooling plate 110 and the spindle 120 are aligned concentrically to each other. The ESC 100 is provided with four connecting pins 108 disposed equidistant from each other. These conductive pins, which protrude partially above the top surface (or support surface) 104 of the ESC 100, are used to establish electrical contacts with the backside of a wafer (not shown) during processing, and serve to improve the chucking performance. The center 100C of the ESC 100 is counter-bored to form a stepped opening 102 which has a larger diameter at the top 102T than at the bottom 102B of the opening 102.

The cooling plate 110, which has an internal cooling channel 114 to accommodate a circulating coolant, is used to cool the ESC 100 during wafer processing. The cooling plate 110 also has a center opening 112 with a diameter larger than the bottom 102B of the stepped opening 102 of the ESC 100.

Figure 2A:
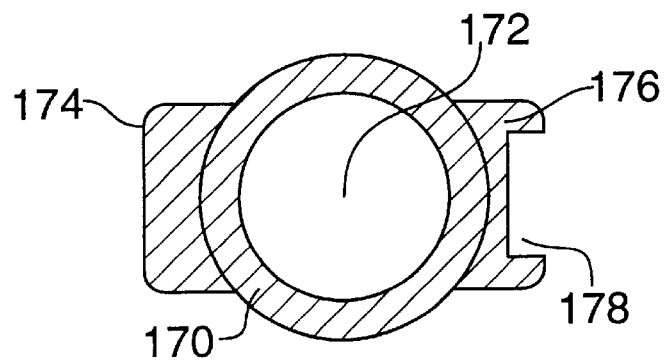
FIG. 2a depicts a top, cross-sectional view of a lastic insulator.

In contrast to wafer support pedestals of other wafer processing systems, the spindle 120 used with a serial ion implanter is designed to be movable in several directions it can translate in a direction orthogonal to the sweeping direction of an incident ion beam, as well as rotate and tilt. The combination of these motions allow a uniform exposure of a wafer to the ion beam. The spindle 120, which is made of stainless steel, is provided with two recesses 126 on the inside 125 of the shaft 124. These recesses 126 are designed to match plastic protrusions 174, 176 (or ears) from a plastic insulator 170, which insulates the valve 140 from the shaft 124. The plastic insulator 170, shown in a cross-sectional view in FIG. 2a, has a center opening 172 which is sized to accommodate the bottom 150B of the valve seat 150 and the valve body 160. The plastic protrusions 174, 176 prevent the insulator 170 and the valve 140 from rotating inside the spindle 120. One of the protrusions 176 has a cutout portion 178 to accommodate electrical connections (not shown) inside the hollow shaft 124.

Figure 2C:
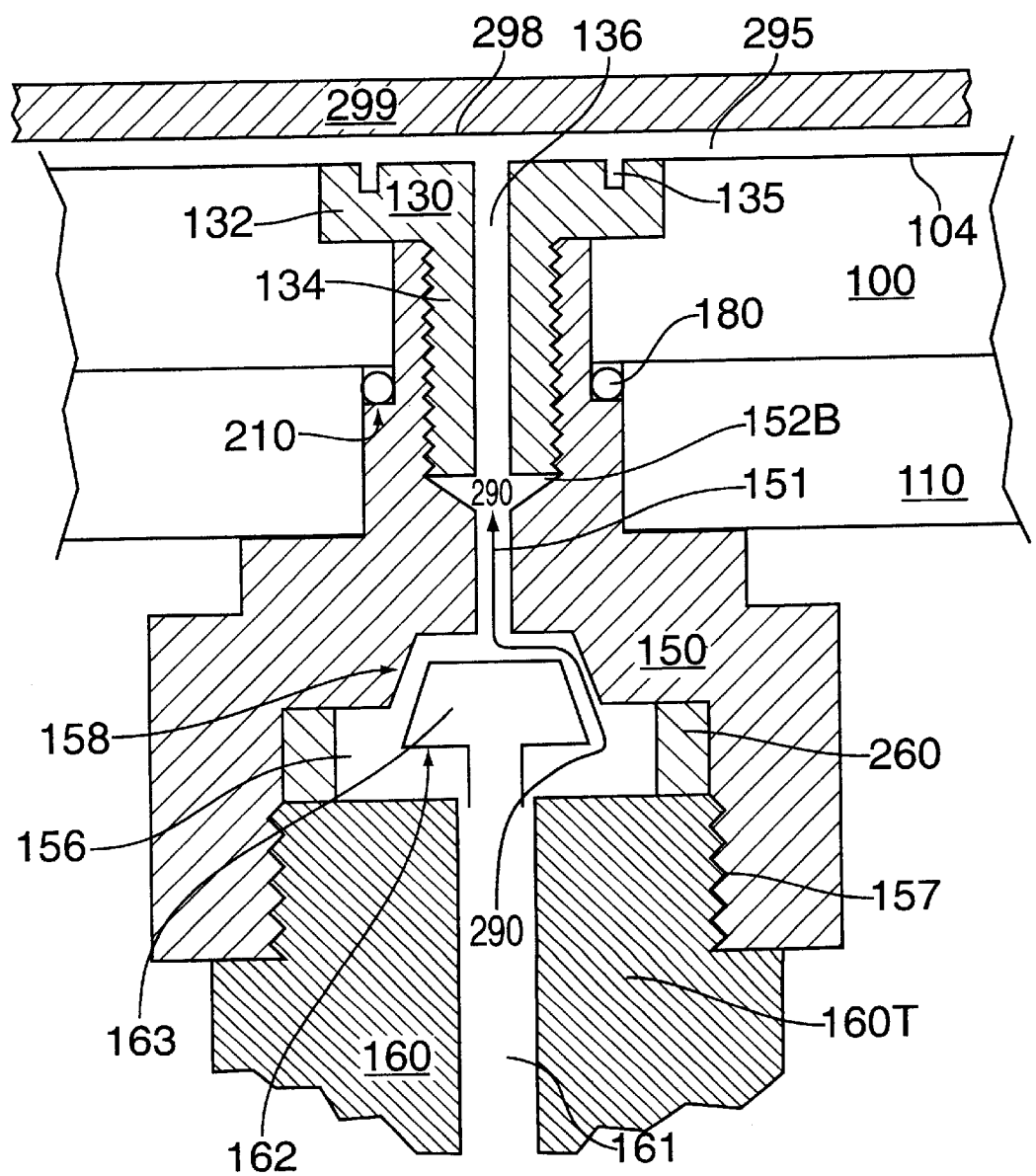
FIG. 2c depicts another expanded schematic cross-sectional view of the poppet, valve seat and batten of FIG. 2b.
Figure 2B:
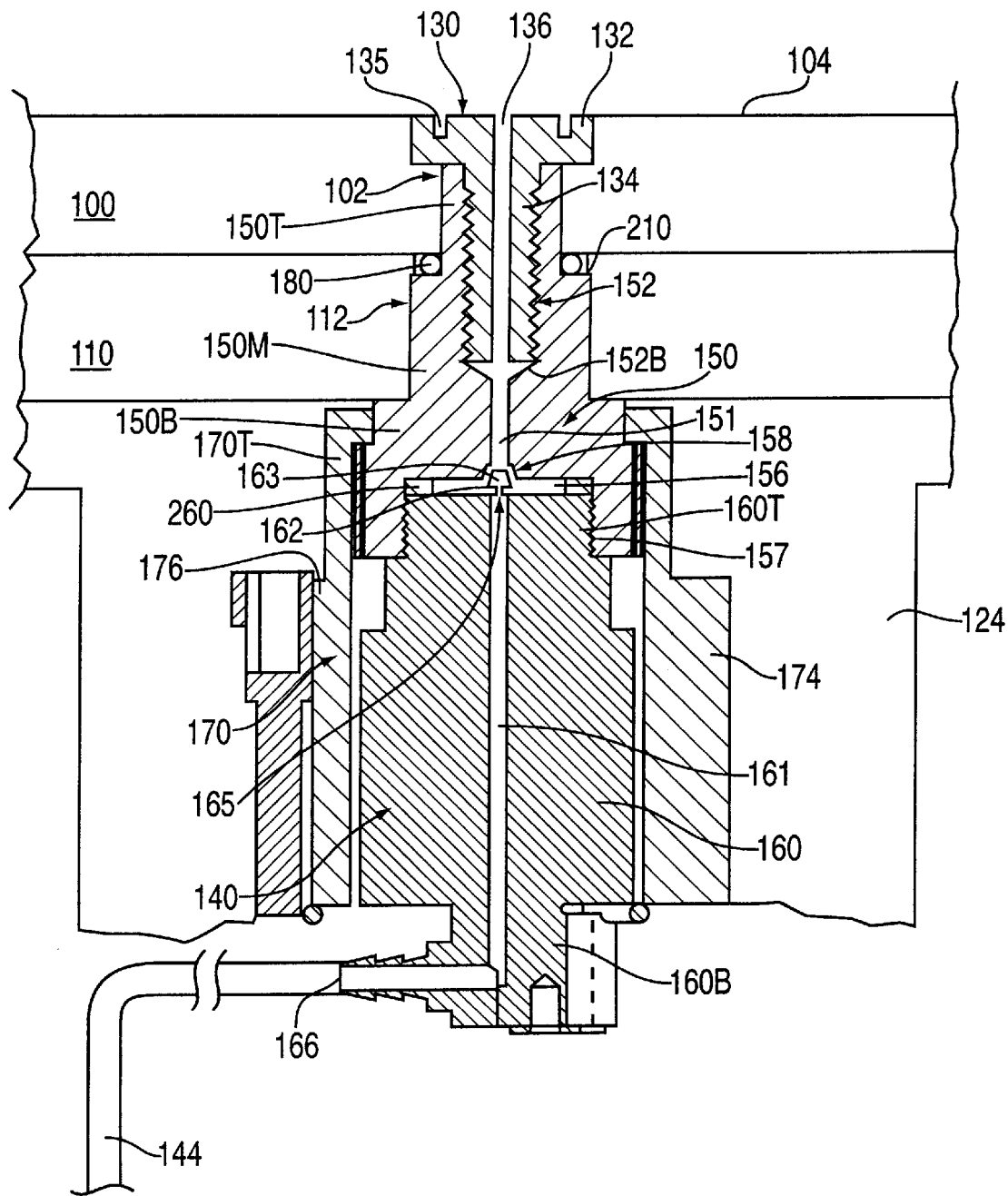
FIG. 2b depicts an expanded schematic cross-sectional view of the valve and the batten of FIG. 1.

FIG. 2b depicts an expanded view of the area around the gas shutoff valve 140 (comprising the valve body 160 and the valve seat 150) and the batten 130. The valve 140 controls the admission of a backside gas, e.g., hydrogen or helium, into the conduit 136 of the batten 130. The valve 140 used in the present embodiment is a customized version (model 99-213) of a commercial Series 99 solenoid valve manufactured by Parker Hannefin Corporation, General Valve Division. Instead of the usual hose connections found on a standard valve, the model 99-213 valve has a custom shaped and fabricated "valve seat" component, which provides for a vacuum seal feature as well as adaptation to a wafer chuck. This particular model is chosen for its compact size, although other comparable alternatives are also acceptable.

The valve seat 150, which is substantially cylindrical, has a step-like structure. The top 150T of the valve seat 150 has an outer diameter equal to the bottom diameter of the stepped opening 102 in the ESC 100. The middle 150M of the valve seat 150 is sized to fit inside the center opening 112 of the cooling plate 110. An O-ring 180 is disposed at a step 210 (between the top 150T and the middle 150M) of the valve seat 150 to provide a vacuum seal between the valve seat 150 and the wafer chuck 100. The bottom 150B of the valve seat 150 is glued to the top 170T of the plastic insulator 170. As such, the valve seat 150 is supported inside the spindle shaft 124, the cooling plate opening 112 and the ESC opening 102. A top recess 152, with a tapered bottom portion 152B, extends from the top 150T of the valve seat 150 and connects, near the middle 150M of the valve seat 150, with a narrow conduit 151 which extends to the bottom 150B of the valve seat 150. The valve seat 150 of the present invention is made of stainless steel, but other materials may also be used.

The bottom 150B of the valve seat 150 is provided with a large centrally-located opening 156, which is threaded on the inside surface 157 to mate with the threaded top portion 160T of the valve body 160. A gasket 260, e.g., a copper gasket, is used to provide a seal between the valve body 160 and the valve seat 150. The valve body 160 has a centrally located conduit 161 extending to the bottom 160B of the valve body 160. The bottom 160B of the valve body 160 has an opening 166, which is connected by a gas line 144 to a pressure controller 142, which is in turn connected to a gas supply source 148, such as a gas tank, by another gas line 146. (See FIG. 1)

FIG. 2b shows a poppet 162 disposed between the bottom 150B of the valve seat and the top 160T of the valve body 160, above the top opening 165 of the valve body 160. The poppet 162 has a top portion 163 which has a trapezoidal cross-section. The poppet 162 is connected to an actuator (not shown) which is used to open or close the valve 140. When the valve 140 is in its normal (closed) position, the poppet 162 is disposed farther away from the top 160T of the valve body 160 and the top portion 163 seals against a bottom recess (or poppet seat) 158 located inside the bottom opening 156 of the valve seat 150. The top portion 163 of the poppet 162 and the bottom recess 158 of the valve seat 150 are complementarily shaped (trapezoidal) to ensure reliable sealing. A gas leak of less than about $10^{-6}$ sccs is achieved in the present embodiment. While such a low leakage is crucial for an ion implanter, the leak rate tolerance can be larger in other wafer processing tools, such as etchers or deposition chambers.

A batten (fastener) 130, which has a flat top portion 132 and an elongated cylindrical portion 134, is disposed inside the top recess 152 of the valve seat 150 and the stepped opening 102 of the ESC 100. The cylindrical portion 134 of the batten 130, which is threaded to mate with the top recess 152 of the valve seat 150, extends partly down the top recess 152, such that the flat top portion 132 rests flush with the top surface 104 of the ESC 100. As such, the batten 130 serves as a fastener, which secures the top portion 150T of the valve seat 150 inside the center opening 102 of the ESC 100. The top portion 132 of the batten 130 has two holes 135 for accommodating a spanner wrench during assembly of the valve 140 and the ESC 100. The batten 130 is provided with a narrow conduit 136 along the entire length of the batten 130. In the present embodiment, the conduit 136 of the batten 130, the tapered bottom portion 152B of the top recess 152 and the conduit 151 of the valve seat 150 form a passageway for a gas to flow from the bottom 150B of the valve seat 150 to the support surface 104 of the ESC 100. The batten 130 of the present embodiment is made of stainless steel, but other materials may also be used.

The solenoid valve 140 is configured to be normally closed, providing positive shutoff of the backside gas. When the valve 140 is actuated to the "open" position by applying an electrical current to the solenoid (not shown) of the valve 140, the poppet 162 is retracted away from the bottom recess 158 of the valve seat 150, as shown in FIG. 2c. In this open position, the top portion 163 of the poppet 162 is located between the top opening 165 of the 151 valve body 160 and the bottom recess 158 of the valve seat 150. As such, a passageway 290 (illustrated by the arrow in FIG. 2c) is formed which allows a backside gas to flow from the valve body 160, through the respective conduits 161, 151, 136 of the valve body 160, valve seat 150 and the batten 130, to the top, or support surface 104 of the ESC 100. When a wafer 299 is "chucked" during wafer processing, a seal is formed between the backside of the wafer 299 and the edge 100E (see FIG. 1) of the ESC 100. The backside gas filling the space 295 between the backside 298 of the wafer 299 and the support surface 104 of the ESC 100 ensures good thermal conduction between the wafer 299 and the ESC 100.

After wafer processing, the valve 140 is closed by sealing the poppet 162 against the bottom recess 158 of the valve seat 150. When the wafer 299 is dechucked, the small amount of backside gas trapped behind the wafer 299, the conduit 136 of the batten 130, and within the valve seat 150 (i.e., inside the conduit 151 and the tapered bottom 152B of the top recess 152) are released into the process chamber. The corresponding volume is designed to be very small, e.g., less than about 5 cm$^3$, and preferably about 1 or 2 cm$^3$, which is negligible compared to the volume of a typical process chamber. As such, there is no noticeable increase in the process chamber pressure, and adverse impact on the ion beam performance can be avoided, despite the release of this trapped backside gas into the process chamber. This design is made possible by the compact size of the valve 140, allowing it to be placed in close proximity to the ESC 100. The need for otherwise long lengths of connecting gas lines can thus be eliminated. In this embodiment, the interiors of the batten 130 and the valve seat 150 substantially define a volume of the backside gas that is released into the process chamber upon dechucking of the wafer 299.

Figure 3A:
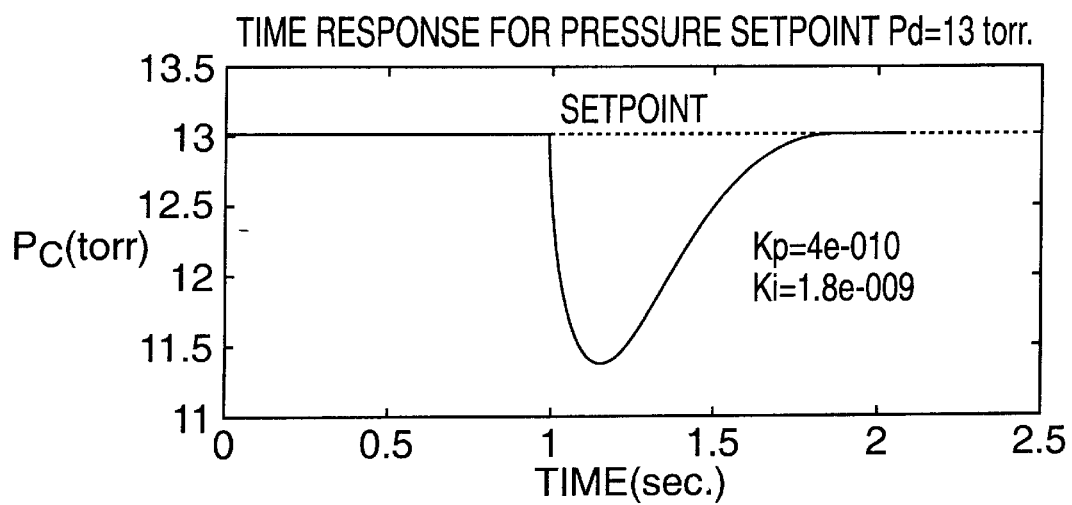
FIG. 3a depicts a simulated pressure response curve at the pressure controller of FIG. 1.
Figure 3B:
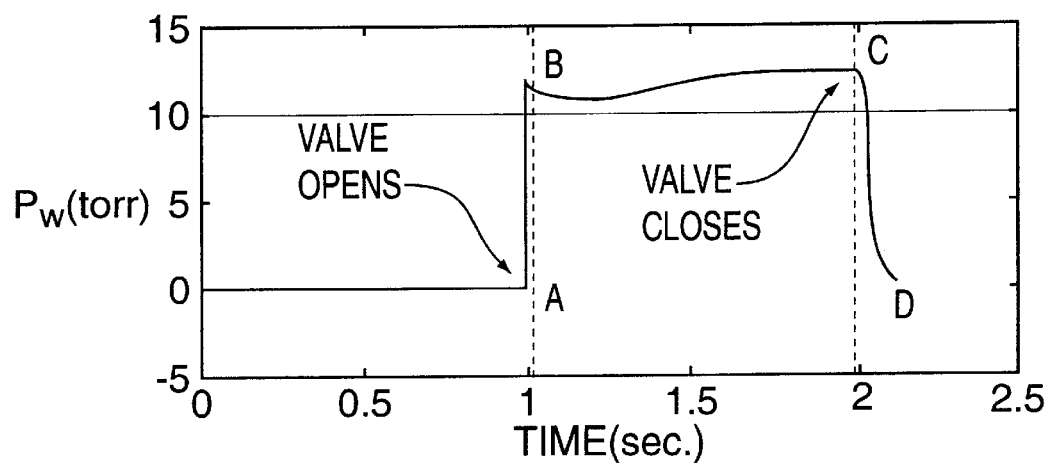
FIG. 3b depicts a simulated pressure response curve at the backside of the wafer of FIG. 2c.

Another aspect of the present invention relates to the use of a pressure controller 142 for backside gas pressure control. Since the heat transfer rate across a gas is dependent on the gas pressure, an improved positioning of the backside pressure controller 142 leads to a more reliable wafer temperature control. In the present embodiment, the pressure controller 142 is connected to the bottom 160B of the valve body 160 by a gas line 144, which is about 9.8 ft. (3 m) long. (See FIG. 1.) By locating the pressure controller 142 closer to the ESC 100, and by decreasing the backside gas volume between the gas valve 140 and the backside 298 of the wafer 299, a faster response time can be achieved for pressure control as well as wafer temperature control. This is illustrated in FIGS. 3a and 3b, which show simulated gas pressure responses as a function of the opening and closing of the gas valve 140. In this example, the backside gas pressure is set at a predetermined pressure of about 13 torr, and the gas valve 140 opens at time (t) of 1 sec. and closes at t=2 sec. FIG. 3a shows the pressure response PC at the pressure controller 142, while FIG. 3b shows the pressure response $P_w$ at the backside 298 the wafer 299 (i.e., within the backside gas volume between the poppet seat 158 and the wafer backside 298). Upon opening the valve 140, the backside gas pressure $P_w$ rises almost instantaneously from point A to B. Such a fast response (e.g., much less than 100 msec.) is possible because of the significantly smaller backside gas volume $V_w$ compared to the total volume $V_c$ between the pressure controller 142 and the wafer 299—i.e., $V_c/V_w \gg 1$. When the valve 140 closes at t=2 sec., the backside gas pressure $P_w$ decreases to about zero torr (or, in practice, the base pressure within the wafer processing system) in less than about 100 msec. The gas line 144 is made of a flexible hose material in order to allow for movement of the spindle 120 in the ion implanter. However, deformation of the gas line 144 results from such movement may lead to a decreased response time in pressure control. Decreasing the length of the gas line 144 help alleviate the problem to a certain degree. The backside gas is supplied to the pressure controller 142 by a gas supply source 148, which is connected to the pressure controller 142 by another gas line 146.

In an alternative embodiment of the present invention, a mass flowmeter can also be incorporated into the gas delivery system. However, since mass flow control is only of interest for steady state control purpose, it is not as crucial as pressure control in the present application.

While the present invention incorporating a backside gas delivery system with minimal backside gas volume is well suited for use in an ion implanter, it can also be adapted for use with other wafer processing systems. Although one embodiment which incorporates the teachings of the present invention has been shown and described in detail herein, those skilled in the art can readily devise many other varied embodiments that still incorporate these teachings.

What is claimed is:

1. An apparatus for a semiconductor wafer processing system comprising:
   a wafer support chuck attached to a gas delivery system having a valve in direct contact with said wafer support chuck;
   a valve seat having a first conduit; and
   a valve body connected to said valve seat; said valve body comprising a second conduit and a poppet capable of being disposed in a first position to provide a passageway between said second conduit and first conduit, and in a second position to provide a sealing contact at one end of said first conduit.

2. The apparatus of claim 1 further comprising a batten connected to said valve seat; wherein said first and second conduits of said valve and a conduit of said batten together define a passageway leading to a support surface of said wafer support chuck.

3. The apparatus of claim 2, wherein said poppet, said valve seat and said batten collectively define a volume inside said apparatus and said volume is less than about 5 cm$^3$.

4. The apparatus of claim 3, wherein said semiconductor wafer processing system is an ion implanter.

5. The apparatus of claim 3 wherein said valve is a solenoid valve.

6. The apparatus of claim 2, wherein said gas delivery system further comprises a means for controlling gas pressure between said valve and a support surface of said wafer support chuck.

7. The apparatus of claim 6, wherein said means for controlling gas pressure is a pressure controller.

8. The apparatus of claim 7, wherein said valve and said support surface of said wafer support chuck defines a first volume, and said pressure controller and said support surface of said wafer support chuck defines a second volume which is significantly greater than said first volume.

9. The apparatus of claim 8, wherein said first volumes is less than about 5 cm³.

10. The apparatus of claim 6, wherein said gas delivery system further comprises a means for delivering a gas at a pre-determined pressure to a support surface of said wafer support chuck within a response time of less than about 100 millisecond.

11. The apparatus of claim 6, wherein said wafer processing system is an ion implanter.

12. The apparatus of claim 1 wherein said gas delivery system further comprises a pressure controller connected to said valve.

13. An apparatus for a semiconductor wafer processing system comprising:

a wafer support chuck having a center opening and a support surface;

a valve seat having a top portion attached inside said center opening of said wafer support chuck, a top recess extending downwards from said top portion to connect with a bottom conduit extending to a bottom opening of said valve seat;

a batten having a top portion, a cylindrical shaft, and a conduit extending from said top portion of said batten to a bottom of said cylindrical shaft, wherein said cylindrical shaft is disposed inside said top recess of said valve seat and said top portion of said batten is disposed inside said center opening of said wafer support chuck;

a valve body having a conduit connecting a top opening of a top threaded portion to a bottom opening, and a poppet disposed above said top opening of said valve body; wherein said top threaded portion is engaged to said bottom opening of said valve seat such that a passageway is formed between said bottom opening of said valve body and said conduit of said batten, and said poppet is capable of a sealing contact at said bottom opening of said valve seat; and a pressure controller connected to said bottom opening of said valve body.

14. The apparatus of claim 13, wherein said wafer processing system is an ion implanter.

15. A gas delivery system for a semiconductor wafer support chuck comprising a gas flow valve and a pressure controller connected to said valve; wherein said valve is adapted for direct attachment to said wafer support chuck; said valve comprising a valve seat having a first conduit and a valve body connected to said valve seat; said valve body comprising a second conduit and a poppet capable of being disposed in a first position to provide a passageway between said second conduit and first conduit, and in a second position to provide a sealing contact at one end of said first conduit.

16. The gas delivery system of claim 15, further comprising a means for delivering a gas to a support surface of said wafer support chuck at a pre-determined pressure within a response time of less than about 100 millisecond.

17. The gas delivery system of claim 16, wherein said gas flow valve and a support surface of said wafer support chuck define a first volume of less than about 5 cm³.

18. The gas delivery system of claim 17, wherein said pressure controller and said support surface of said wafer support chuck define a second volume which is significantly greater than said first volume.

19. The gas delivery system of claim 15 wherein said wafer processing system is an ion implanter.

* * * * *